United States Patent

Sassiat et al.

(10) Patent No.: US 9,396,950 B2
(45) Date of Patent: Jul. 19, 2016

(54) LOW THERMAL BUDGET SCHEMES IN SEMICONDUCTOR DEVICE FABRICATION

(71) Applicant: GLOBALFOUNDRIES Inc., Grand Cayman (KY)

(72) Inventors: Nicolas Sassiat, Dresden (DE); Jan Hoentschel, Dresden (DE); Torben Balzer, Dresden (DE); Alban Zaka, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/184,863

(22) Filed: Feb. 20, 2014

(65) Prior Publication Data

US 2014/0264349 A1    Sep. 18, 2014

Related U.S. Application Data

(60) Provisional application No. 61/791,956, filed on Mar. 15, 2013.

(51) Int. Cl.
*H01L 21/336* (2006.01)
*H01L 21/265* (2006.01)
*H01L 21/324* (2006.01)
*H01L 29/66* (2006.01)
*H01L 29/78* (2006.01)

(52) U.S. Cl.
CPC ........ *H01L 21/26506* (2013.01); *H01L 21/324* (2013.01); *H01L 29/6656* (2013.01); *H01L 29/6659* (2013.01); *H01L 29/7833* (2013.01)

(58) Field of Classification Search
None
See application file for complete search history.

(56) References Cited

U.S. PATENT DOCUMENTS

| 6,180,476 B1* | 1/2001 | Yu ..................... H01L 21/26506 257/E21.335 |
| 6,432,802 B1* | 8/2002 | Noda ................. H01L 21/26506 257/E21.335 |
| 2005/0054173 A1* | 3/2005 | Wang ................ H01L 21/26513 438/369 |
| 2008/0242031 A1* | 10/2008 | Lee ................... H01L 21/26506 438/285 |
| 2011/0151635 A1 | 6/2011 | Liu et al. ...................... 438/301 |

FOREIGN PATENT DOCUMENTS

TW       201123277 A1    7/2011    ............. H01L 21/28

OTHER PUBLICATIONS

Translation of Official Action from Taiwanese Patent Application No. 103109390, dated Oct. 13, 2015.

* cited by examiner

*Primary Examiner* — Benjamin Sandvik
*Assistant Examiner* — Herve Assouman
(74) *Attorney, Agent, or Firm* — Amerson Law Firm, PLLC

(57) ABSTRACT

In aspects of the present invention, a method of forming a semiconductor device is disclosed, wherein amorphous regions are formed at an early stage during fabrication and the amorphous regions are conserved during subsequent processing sequences, and an intermediate semiconductor device structure with amorphous regions are provided at an early stage during fabrication. Herein a gate structure is provided over a semiconductor substrate and amorphous regions are formed adjacent the gate structure. Source/drain extension regions or source/drain regions are formed in the amorphous regions. In some illustrative embodiments, fluorine may be implanted into the amorphous regions. After the source/drain extension regions and/or the source/drain regions are formed, a rapid thermal anneal process is performed.

16 Claims, 6 Drawing Sheets

LOW THERMAL BUDGET SCHEMES IN SEMICONDUCTOR DEVICE FABRICATION

BACKGROUND OF THE INVENTION

1. Field of the Invention

The present disclosure relates to low thermal budget schemes in semiconductor device fabrication, and, more particularly, to optimized low thermal budget schemes for improved performances of advanced semiconductor device structures.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are based on silicon devices, due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices.

One important aspect in manufacturing field effect transistors having reduced dimensions is the reduction of the length of the gate electrode that controls the formation of a conductive channel separating the source and drain regions of the transistor. Another aspect of down-scaling transistors is the improved frequency response which is proportional to 1/L, L being the gate length. Furthermore, decreasing the channel length and the gate oxide thickness increases the current drive of a transistor.

In transistor elements, source and drain regions are provided by conductive semiconductor regions including dopants of an inverse conductivity type compared to the dopants in the surrounding crystalline active region, e.g., a substrate or a well region. Upon applying a sufficiently high voltage signal to a gate electrode which is disposed on the active region, a conducting region in the crystalline active region between the source and drain regions is induced. Although the gate length has been reduced in efforts to obtain smaller and faster transistor elements, it turns out, however, that a plurality of issues are additionally involved to maintain proper transistor performance at reduced gate lengths.

Many of the front-end-of-line (FEOL) fabrication processes involve implantation sequences in order to implement a specific dopant concentration profile in specific regions of a semiconductor substrate. The introduction of a high dose of dopants into a crystalline substrate area, however, generates heavy damage in the crystal structure, and, therefore, one or more anneal cycles are typically required for curing the crystal damages, while the dopants are also activated. For example, the electrical activation of implanted boron shows a relative maximum at temperatures of 500° C., where the dopants are incorporated and damages are healed. Increasing the temperature leads to increased accumulation of dopants at defects, while, upon further increasing the temperature, appropriate incorporation of dopants takes place.

In addition to dopant activation and curing of crystal damages, however, dopant diffusion occurs during annealing processes. Herein, dopant diffusion increases with increasing temperature, leading to a "blurring" of dopant profiles at high temperatures. For defining critical transistor properties, such as the overlap between the extension regions and the gate electrode, dopant diffusion may be advantageous. In other areas of the drain and source regions, dopant diffusion may be undesired, such as in deeper lying portions where the diffusion may reduce the dopant concentration at PN junction areas, thereby reducing the conductivity at the vicinity of these areas.

Thus, on the one hand, a high anneal temperature may be desirable in view of a high degree of dopant activation, re-crystallization of implantation-induced lattice damage and a desired diffusion at shallow areas of the extension regions, while, on the other hand, the duration of the anneal process should be short in order to restrict the degree of dopant diffusion in the deeper drain and source regions, which may reduce the dopant gradient at the respective PN junctions and also reduce the overall conductivity due to reducing the averaged dopant concentration.

Furthermore, very high temperatures during the anneal process may have a negative effect on gate insulation layers and reduce the reliability thereof. That is, high anneal temperatures may degrade the gate insulation layer and affect the dielectric characteristics thereof, resulting in increased leakage currents, reduced breakdown voltage and the like. Therefore, particularly in the case of highly advanced transistors, the positioning, shaping and maintaining of a desired dopant profile are important properties for defining the final performance of the device, as the overall series resistance of the conductive path between the drain and source contacts may represent dominant parts for determining a transistor's performance.

Traditional rapid thermal anneal (RTA) processes are conventionally performed by heating the entire carrier material to a desired temperature. Alternatively, radiation-based anneal techniques have also been applied, which cause non-equilibrium conditions wherein a high amount of power is supplied within extremely short time intervals and thereby the required extremely high temperatures are provided. In advanced manufacturing regimes, traditional RTA processes are frequently supplemented (in the form of pre-anneal processes) or replaced by advanced radiation-based anneal processes in order to obtain a high degree of dopant activation and re-crystallization active regions. However, adjusting the effective channel length on the basis of a well-controlled diffusion of the dopants becomes more and more difficult in highly-integrated circuits having strongly scaled semiconductor devices, as pointed out above.

As the above-described state in the art does not comply with requirements on advanced semiconductor devices, there is a need for providing optimized process flows for FEOL processes which allow for the implementation of well-defined dopant profiles within sophisticated semiconductor devices.

It is desirable to provide methods of forming a semiconductor device that provide semiconductor devices or intermediate semiconductor device structures that show improved performance, particularly when high-k materials are employed, without introducing complex additional sequences into existing process flows.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides, in some aspects, a method of forming a semiconductor device, wherein amorphous regions are formed at an early stage during fabrication and the amorphous regions are conserved during subsequent processing sequences. In other aspects, an intermediate semiconductor device structure with amorphous regions is provided at an early stage during fabrication.

In one aspect of the present disclosure, a method of fabricating a semiconductor device is provided. In some illustrative embodiments, the method includes providing a gate structure over a semiconductor substrate, performing a pre-amorphization implant process for forming amorphous regions adjacent the gate structure, performing a first implantation process for forming source/drain extension regions in the amorphous regions and performing a second implantation process for forming source/drain regions in the amorphous regions.

In another aspect of the present disclosure, a method of fabricating a semiconductor device is provided. In some illustrative embodiments, the method includes providing a gate structure over a semiconductor substrate, performing a pre-amorphization implant process for forming amorphous regions adjacent the gate structure, performing a first implantation process for forming source/drain extension regions in the amorphous regions, performing a second implantation process for forming source/drain regions in the amorphous regions, performing a third implantation process for implanting fluorine into the amorphous regions and performing a rapid thermal anneal process after the source/drain regions are formed in the amorphous regions.

In still another aspect of the present invention, an intermediate semiconductor device structure is provided. In some illustrative embodiments, the intermediate semiconductor device structure includes a gate structure disposed over a semiconductor substrate, a spacer structure formed adjacent to the gate structure, amorphous regions formed adjacent to the gate structure at each side of the gate structure, the amorphous regions being aligned with regard to the gate structure, source/drain extension regions formed within the amorphous regions and source/drain regions formed within the amorphous regions.

BRIEF DESCRIPTION OF THE DRAWINGS

The disclosure may be understood by reference to the following description taken in conjunction with the accompanying drawings, in which like reference numerals identify like elements, and in which.

Figure 1A:
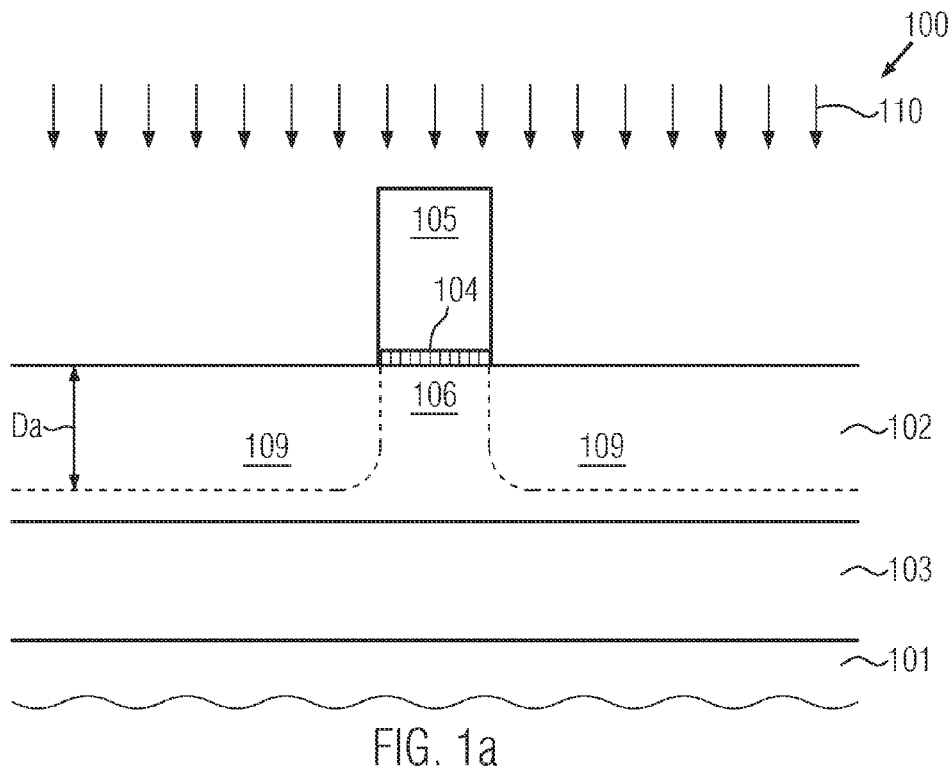
FIGS. 1a-1d schematically illustrate cross-sectional views of a semiconductor device at various stages during fabrication for forming drain and source regions on the basis of a low thermal budget process flow, in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor device structures and particularly to semiconductor devices such as metal oxide semiconductor devices or MOS devices. The person skilled in the art will appreciate that, although the expression "MOS device" is used, no limitation to a metal-containing gate material and/or to an oxide-containing gate dielectric material is intended. Semiconductor devices of the present disclosure and particularly MOS devices as illustrated by means of some illustrative embodiments as described herein concern devices fabricated by using advanced technologies. Semiconductor devices and particularly MOS devices of the present disclosure are fabricated by technologies applied to approach technology nodes smaller than 100 nm, for example 90 nm or smaller, or smaller than 50 nm, for example 45 nm or smaller, or smaller than 35 nm, for example 32 nm or smaller, or at about 28 nm.

The person skilled in the art will appreciate that the present disclosure suggests semiconductor devices, and particularly MOS devices, comprising gate structures such as gate stacks having a gate electrode material layer and a gate dielectric material layer with a length dimension smaller than 100 nm, for example smaller than 50 nm or smaller than 35 nm. A length dimension may be understood as taken along a direction having a non-vanishing projection along a direction of a current flow between source and drain when the MOS device is in an ON state, the length dimension being, for example, parallel to the direction of current flow between source and drain.

The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. In general, a MOS transistor may be formed by defining an active region in a semiconductor substrate. The active region may be understood as a region of the semiconductor substrate in and on which a MOS transistor is to be fabricated. The active region may be, for example, appropriately doped and/or may be delimited by an appropriate insulating structure, such as STI (shallow trench isolation) structures and the like. The active region of PMOS transistors may be doped with N-type dopants, while the active region of NMOS transistors may be doped with P-type dopants. Alternatively, the active regions of PMOS and/or NMOS transistors may remain undoped. Additionally or alternatively, the active region of PMOS transistors may be covered by a thin layer of SiGe material (cSiGe) which is used for adjusting the threshold voltage of PMOS transistors.

A circuit designer can mix and match device types, using PMOS and NMOS transistors, stressed and unstressed, to take advantage of the best characteristics of each device type as they best suit the circuit being designed. The person skilled in the art understands that stress and strain may be generally described with regard to the tensile modulus.

The present disclosure provides an intermediate semiconductor device structure, wherein amorphous regions are formed in a semiconductor substrate at an early stage during fabrication. For example, amorphous regions may be formed in an active region provided in the semiconductor substrate. In accordance with aspects of the present disclosure, the amorphous regions are formed in alignment with a gate structure that is formed on the semiconductor substrate, e.g., on the active region. The gate structure may comprise a gate stack having one or more gate insulating layers, one or more work function adjusting layers and a gate electrode layer. The gate electrode layer may comprise a gate metal material or polysilicon. The gate insulating layers may comprise a high-k material, such as $HfO_2$, HfSiON and a combination thereof.

In some illustrative embodiments, the amorphous regions may be formed by performing a pre-amorphization implant process, for example by implanting a heavy species. In some special illustrative embodiments, at least one of silicon (Si) and germanium (Ge) atoms may be implanted into the active region during the pre-amorphization implant process. Additionally or alternatively, the pre-amorphization implant process may be performed at a high implantation dose, for example an implantation dose of more than $1.0E13$ atoms/$cm^2$ or more than $1.0E14$ atoms/$cm^2$ or more than $1.0E15$ atoms/$cm^2$. For example, the implantation dose may be in a range from about $1.0E13$ atoms/$cm^2$ to about $1.0E15$ atoms/$cm^2$ or in a range from about $1.0E14$ atoms/$cm^2$ to about $1.0E15$ atoms/$cm^2$. The amorphous regions may be formed in alignment with the gate structure adjacent to the gate structure at each side of the gate structure in the semiconductor substrate, e.g., in the active region.

In some illustrative embodiments, at least one of source/drain regions and source/drain extension regions are formed in the amorphous regions. Accordingly, an implantation process for forming source/drain regions may be performed and/or another implantation process for forming source/drain extension regions may be performed. For example, a first implantation process for the source/drain extension regions may be performed and subsequently a second implantation process for forming the source/drain regions may be performed.

In accordance with an illustrative embodiment herein, a rapid thermal anneal process is performed subsequent to the formation of source/drain regions and/or source/drain extension regions for activating the implanted dopants and for healing crystal damages induced by the implantation processes. In aspects of the present disclosure, no process step is performed after the pre-amorphization implant process and prior to the rapid thermal anneal process that has a temperature of higher than 450° C. For example, no temperature higher than 400° C. is applied after the pre-amorphization implant process and prior to the rapid thermal anneal process. Particularly, a thermal budget of processes performed subsequent to performing the pre-amorphization and prior to performing the rapid thermal anneal process is lower than 450° C. or even lower than 400° C. Accordingly, any process performed subsequently to the pre-amorphization implant process and prior to rapid thermal anneal has a temperature lower than 450° C. or lower than 400° C. That is, the semiconductor substrate is not exposed to temperatures higher than 450° C. or higher than 400° C. after the pre-amorphization implant process has been performed and before the rapid thermal anneal process is applied.

In some illustrative embodiments, a first spacer structure is formed at each side of the gate structure prior to performing the first implantation process. The first spacer structure may be formed by depositing a first spacer-forming material and applying an anisotropic etching process for removing the first spacer-forming material formed on the semiconductor substrate such that the first spacer-forming material covering sidewalls of the gate structure remains. In some special examples herein, the first spacer-forming material is deposited after the amorphous regions are formed in the semiconductor substrate. Accordingly, a first spacer structure comprising sidewall spacers covering sidewalls of the gate structure may be formed. In accordance with an advantageous illustrative embodiment herein, forming the first spacer structure comprises performing an atomic layer deposition (ALD) process for depositing the first spacer-forming material. In performing the first implantation process subsequent to the formation of the first spacer structure, source/drain extension regions in alignment with the first spacer structure may be formed in the semiconductor substrate at each side of the gate structure. For example, the first spacer structure may comprise a spacer liner or the first spacer structure may be provided by a spacer liner (e.g., "spacer zero").

In some illustrative embodiments, a second spacer structure is formed at each side of the gate structure prior to performing the second implantation process and after the first implantation process is performed. The second spacer structure may be formed by depositing a second spacer-forming material and applying an anisotropic etching process for removing the second spacer-forming material formed over the semiconductor substrate such that the second spacer-forming material covering the first spacer structure formed on the sidewalls of the gate structure remains. Accordingly, a second spacer structure comprising sidewall spacers covering the first spacer structure formed on the sidewalls of the gate structure may be formed. In accordance with an advantageous illustrative embodiment herein, forming the second spacer structure comprises performing an atomic layer deposition (ALD) process for depositing the second spacer-forming material. In performing the second implantation process subsequent to the formation of the second spacer structure, source/drain regions in alignment with the second spacer structure may be formed in the semiconductor substrate at each side of the gate structure. For example, the second spacer structure may comprise a spacer layer (e.g., "spacer one") adjusting a separation between source and drain. In another example, the second spacer structure may comprise a spacer liner and a spacer layer disposed on the spacer liner, wherein an advantageous encapsulation of a gate dielectric may be obtained.

In some illustrative embodiments of the present disclosure, the method comprises a third implantation process for implanting fluorine into the amorphous regions. In some special illustrative embodiments herein, only NMOS devices are exposed to the third implantation process such that fluorine is implanted into the semiconductor substrate of NMOS devices in alignment with the gate structure of NMOS devices. Herein, PMOS devices may be protected by an appropriate masking pattern, such as a lithographically patterned resist layer, for example. The third implantation process is performed after the first implantation process. In some explicit examples, the third implantation process may be performed during or after formation of the source/drain regions. For example, the third implantation process is performed subsequent to or simultaneous with the second implantation process. Alternatively, the third implantation process may be performed prior to the second implantation process.

In describing the following figures, semiconductor devices, semiconductor device structures and methods of forming a semiconductor device and a semiconductor device structure in accordance with various exemplary embodiments of the present disclosure will be illustrated. The described process steps, procedures and materials are to be considered only as exemplary embodiments designed to illustrate to one of ordinary skill in the art, methods for practicing the invention. However, it is to be understood that the invention is not exclusively limited to the illustrated and described exemplary embodiments as many possible modifications and changes exist which will become clear to the ordinary person skilled in the art when studying the present detailed description together with the accompanied drawings and the above background and summary of the invention. Illustrated portions of semiconductor devices and semiconductor device structures may include only a single MOS structure, although those skilled in the art will recognize that actual implementations of integrated circuits may include a large number of such structures. Various steps in the manufacture of semiconductor devices and semiconductor device structures are well known and so, in the interest of brevity, many conventional steps will only be mentioned briefly herein, or will be omitted entirely without providing the well-known process details.

In this respect, it should be appreciated that statements with respect to the position of any features of a semiconductor device as illustrated in the figures are to be considered as relative positional information. A semiconductor substrate or a buried insulating layer or a respective surface or interface may represent a corresponding reference. That is, terms such as "above," "over," "on" and other similar terms may indicate the position with respect to the respective surface or layer, such as a buried insulating layer and/or a semiconductor substrate, in order to indicate that a feature under consideration has a greater distance to the substrate or the buried insulating layer compared to a feature that is located "below" the feature under consideration. For instance, in this sense, a gate structure may be formed on the semiconductor substrate in a bulk configuration or over the buried insulating layer in an SOI configuration. Similarly, a lateral direction may represent a direction that extends substantially perpendicular to a normal direction associated with a surface of the semiconductor substrate on which a gate structure is provided. Hence, lateral directions may be understood as a horizontal direction in FIGS. 1a-2c, such as representing a transistor length direction, for example.

FIG. 1a schematically illustrates a cross-sectional view of a semiconductor device 100 at a stage during fabrication when a gate structure is formed on a semiconductor layer 102. The gate structure may comprise a gate electrode 105 and a gate dielectric 104. The semiconductor device 100 may represent a type of sophisticated field effect transistor as typically used in sophisticated integrated circuits, such as microprocessors, storage chips and the like.

As illustrated in FIG. 1a, the semiconductor device 100 comprises a substrate 101, which may represent any appropriate carrier material for forming thereon a buried insulating layer 103 and an appropriate semiconductor layer 102, in and above which respective circuit components, such as the semiconductor device 100, are to be formed. For example, the substrate 101 may represent a silicon substrate or any other appropriate material, thereby defining an SOI (silicon-on-insulator) configuration. The person skilled in the art will appreciate that, in omitting the buried insulating layer 103, a bulk configuration may be provided in which the semiconductor layer 102 may be identified with the semiconductor substrate.

The gate electrode 105 may comprise polysilicon or another metal material as known in the art and may be formed above the semiconductor layer 102. The gate electrode may be separated from the semiconductor layer 102 by a gate insulation layer 104.

At the stage illustrated in FIG. 1a, a pre-amorphization implant process 110 may be performed to damage the crystalline structure of the semiconductor layer 102 adjacent to the gate electrode 105 such that amorphous regions 109 are formed in alignment with the gate structure at each side thereof in the semiconductor layer 102. As will be explained later, defining the amorphous regions 109 may result in an enhanced isotropy during the formation of source/drain extension regions and further implantation processes performed at later stages.

In accordance with some illustrative embodiments, the pre-amorphization implant process 110 may be performed, for example, by implanting at least one of Si and Ge particles into the semiconductor layer 102. In some special illustrative examples herein, the implantation dose may be on the order of $3E14$ cm$^{-2}$. In some illustrative embodiments, the implantation energy of the pre-amorphization implant process may be on the order of 5-50 keV, such as on the order of 10-40 keV or on the order of 10-30 keV, for example. In accordance with some illustrative embodiments, the implant dose may be on the order of about $10^{13}$ cm$^{-2}$ to about $10^{15}$ cm$^{-2}$, such as on the order of about $1\times10^{14}$ cm$^{-2}$ to $5\times10^{14}$ cm$^{-2}$ or on the order of about $3\times10^{14}$ cm$^{-2}$.

The amorphous regions 109 (as indicated by the broken lines in the figures) may have a depth Da that is greater than about 5 nm or greater than about 7 nm. For example, the depth Da may be greater than 7.2 nm. In some special illustrative examples, the depth Da may represent a maximum depth of the amorphous regions 109. For example, the maximum depth Da may be substantially smaller than about 50 nm or smaller than 45 nm or smaller than about 40 nm. In some examples, the maximum depth Da is in a range between 5-50 nm or in a range between 7-50 nm or in a range between 5-45 nm or in a range between 7-45 nm or in a range between 5-40 nm or in a range between 7-40 nm.

It should be appreciated that the length of a channel region 106 formed in the semiconductor layer 102 underneath the gate structure in the horizontal direction depends on the length of the gate electrode 105. It is appreciated that the actual effective channel length may be adjusted by respective PN junctions formed at later stages by source/drain extension regions limiting the channel region 106 in the horizontal direction.

The semiconductor device 100 as schematically shown in FIG. 1a may be formed on the basis of the following well-established processes. After providing the semiconductor layer 102 (in the SOI configuration as illustrated or as a semiconductor substrate in the bulk configuration), respective isolation structures (not shown), such as shallow trench isolations (STI) and the like, may be formed so as to define appropriately sized active regions within the semiconductor layer 102, in which one or more circuit components may be formed, such as the semiconductor device 100. For this purpose, sophisticated lithography, etch, deposition and planarization techniques may be used. Subsequently, the doping of the channel region 106 may be adjusted in accordance with transistor requirements, as explained above.

Thereafter, appropriate materials for the gate electrode 105 and the gate insulation layer 104 may be provided, for instance by oxidation and/or deposition for the gate insulation layer 104 and by deposition of the material of the gate electrode 105, followed by advanced lithography and etch techniques in order to appropriately define the lateral dimensions of the gate electrode 105. In sophisticated applications, the gate length may be in the range of approximately 50 nm and even less for highly advanced semiconductor devices.

Next, a first spacer structure may be formed on the basis of conformal deposition techniques and/or oxidation processes, followed by an anisotropic etch process. In some illustrative embodiments, the spacer structure may comprise one or more spacer layers, wherein the initial layer thickness and the respective etch conditions may substantially deter-mine a target width of the first spacer structure. For example, the first spacer structure may be formed by depositing one or more spacer-forming materials by means of an ALD process with a process temperature substantially lower than about 450° C. or substantially lower than about 400° C. In accordance with an illustrative example, the first spacer structure may be deposited at low temperatures, such as about room temperature. In a special illustrative example, the first spacer structure is formed by a thin spacer liner 107 ("spacer zero") of one of silicon oxide and silicon nitride material, as illustrated in FIG. 1b.

Subsequent to the formation of the spacer liner 107, other implantation processes may be performed, such as source/drain extension region implantation and optional halo implantations. At the stage as illustrated in FIG. 1b, a first implantation process 112 may be performed so as to introduce dopants into the semiconductor layer 102 such that source/drain extension regions 108E are formed in alignment with the spacer liner 107 within the amorphous regions 109. Herein a respective offset to the gate electrode 105 is obtained by the spacer liner 107. In case that the semiconductor device 100 under fabrication is to be implemented as an NMOS device, dopants provided by group 5 elements (e.g., P, As, Sb and the like) are implanted into the amorphous regions 109 to result in N-type source/drain extension regions 108E. In case that the semiconductor device 100 under fabrication is to be implemented as a PMOS device, dopants provided by group 3 elements (e.g., B, Al and the like) are implanted into the amorphous regions 109 to result in P-type source/drain extension regions 108E.

Figure 1B:
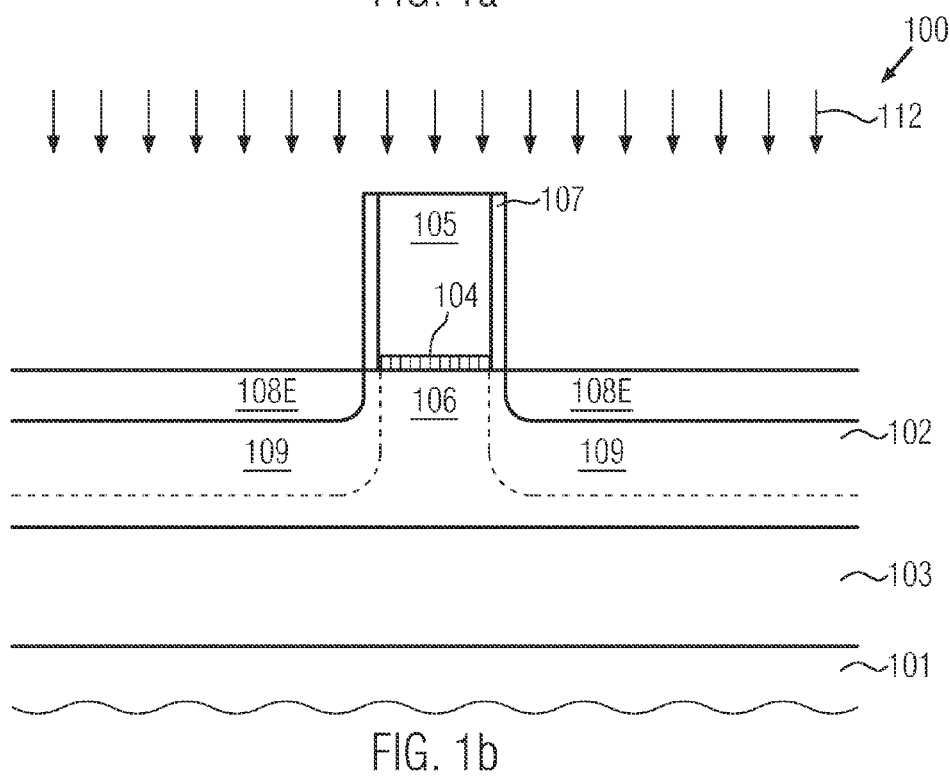

The person skilled in the art will appreciate that a thermal budget at the stage depicted in FIG. 1b is substantially lower than about 450° C. or lower than about 400° C. The inventors understood that, for a low thermal budget at the formation of the source/drain extension regions 108E, early substrate re-crystallization is avoided and the engineering of the source/drain extension regions 108E may be improved, therefore, improving device performance. For example, a well-defined dopant profile may be implanted during the first implantation process 112 such that the source/drain extension regions 108E may be formed at high accuracy. For instance, the amorphized portion 109 may result in highly uniform conditions during the first implantation process 112. The person skilled in the art will appreciate that due to the depth Da of the amorphous regions 109, the source/drain extension regions are substantially restricted to the amorphous regions 109.

Figure 1C:
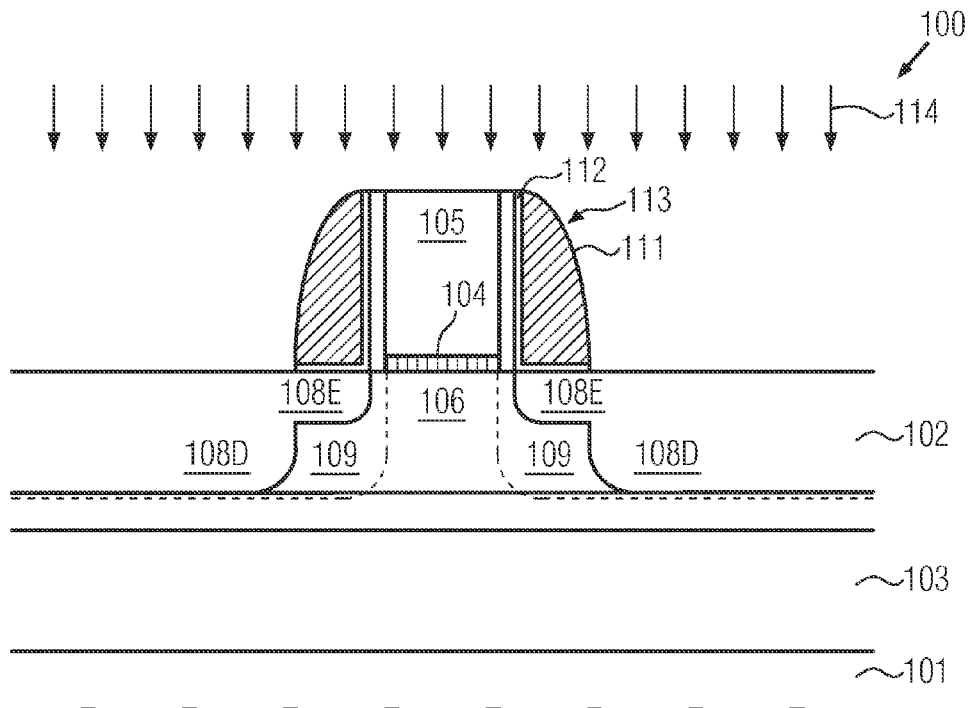

FIG. 1c schematically illustrates the transistor device 100 in a further advanced manufacturing stage. As shown, a second spacer structure 113 may be provided adjacent to the gate structure, i.e., the gate electrode 105 and the gate dielectric 104, and on the first spacer structure, i.e., the spacer liner 107 (see FIG. 1b). The second spacer structure 113 may be formed by a combination of a spacer element 111 ("spacer one") and an encapsulating layer 112. The encapsulating layer 112 may provide an etch stop and further encapsulation of the gate dielectric 104. The second spacer structure 113 may also comprise additional individual spacer elements (not shown) depending on the respective process requirements. The spacer element 111 may be comprised of any appropriate material, such as silicon nitride or silicon oxide, and may have a width adapted to define drain and source regions 108D formed by a second implantation process 114 performed after formation of the second spacer structure 113. For example, the second spacer structure 113 may be formed by depositing one or more spacer-forming materials by means of an ALD process with a process temperature substantially lower than about 450° C. or substantially lower than about 400° C. In accordance with an illustrative example, the second spacer structure 113 may be deposited at low temperatures, such as about room temperature.

The person skilled in the art will appreciate that a thermal budget up to the stage depicted in FIG. 1c is substantially lower than about 450° C. or lower than about 400° C. In some illustrative embodiments, process parameters may be selected such that drain and source regions 108D as implanted may be defined within the amorphous regions 109, thereby providing highly uniform implantation conditions due to the reduction or avoidance of channeling effects. The person skilled in the art will appreciate that an overall width of the second spacer structure 113 may be correlated with an overall configuration of the drain and source regions 108D and the source/drain extension regions 108E, wherein a width of the second spacer structure 113 and a thickness of the first spacer structure may be correlated in order to obtain a desired effective channel length for the channel region 106 after a corresponding anneal process is to be performed at a later stage for activating the implants.

Figure 1D:
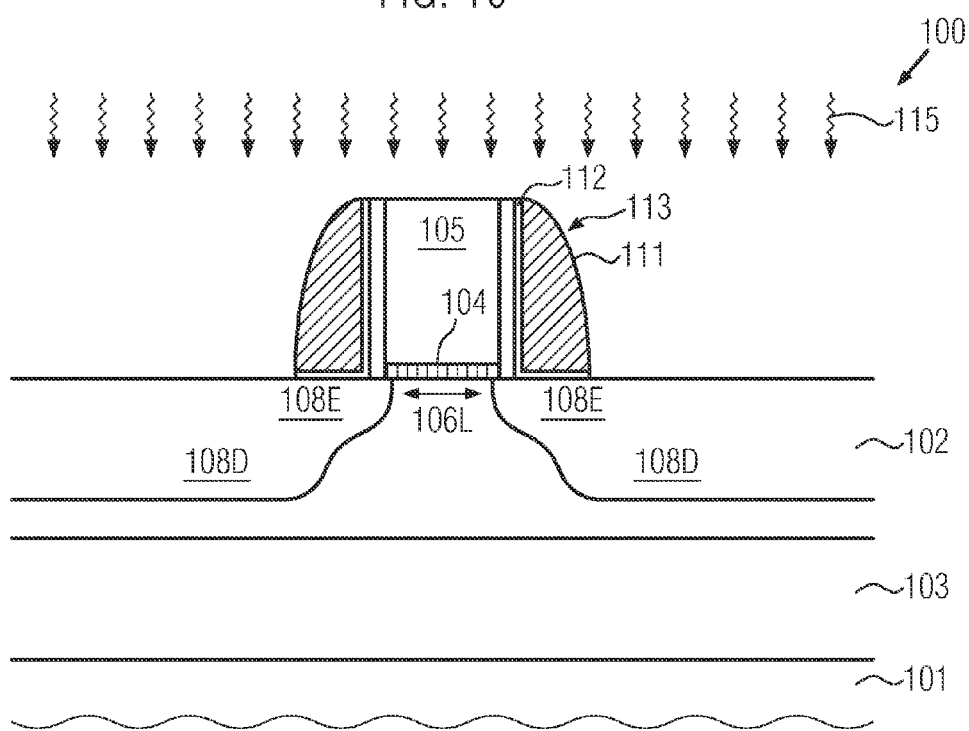

FIG. 1d schematically illustrates the semiconductor device 100 during a corresponding anneal process 115, which may be a conventional RTA (rapid thermal anneal) process, wherein respective process parameters, that is, the effective anneal temperature and the duration of the process, may be selected such that desired lateral and vertical profiles of the drain and source regions 108D are obtained. As indicated, if the drain and source regions 108D are to be extended substantially down to the buried insulating layer 103, moderately high anneal temperatures in combination with relatively long process times may be required, thereby also necessitating an increased width of the spacer structure 113 in order to obtain a desired effective channel length 106L. Consequently, for highly sophisticated applications, the required width of the spacer structure 113 may not allow further reducing the overall length dimension of the transistor 100, when an increased depth of the drain and source regions 108D is required. On the other hand, using highly advanced anneal techniques, such as laser-based or flash lamp-based processes with extremely short anneal times, may not efficiently allow the increase of the drain and source regions 108D in the depth direction and may, therefore, require additional measures so as to obtain the desired effective channel length 106L and an increased vertical extension of the drain and source regions 108D. For instance, drain and source regions 108D may be formed prior to defining the source/drain extension regions 108E, wherein a respective anneal process may be performed so as to obtain a high diffusion activity. Thereafter, the respective extension regions may be defined by a corresponding implantation process followed by an anneal process with significantly reduced diffusion activity, as may be accomplished on the basis of the above-specified advanced anneal techniques. In this case, however, several additional process steps may be required, such as the removal of the spacers, forming additional spacer elements during the subsequent processing after defining the drain and source regions and the like.

For example, an RTA process as described above or any other radiation-based process may be performed as the anneal process 115, the anneal process 115 having appropriate process parameters in order to activate the implanted dopants and heal crystal damages caused by any of the previous implantation processes. For instance, the anneal process 115 may comprise a heat treatment on the basis of moderately low temperatures of approximately 500-800° C., at which diffusion of dopants may be moderately low. In this case, an efficient re-crystallization may be obtained, wherein also effectively dopant atoms may be positioned at lattice sites. In other cases, a moderately high temperature may be applied so as to provide the desired dopant diffusion, wherein, prior to or after the application of the moderately high temperature, for instance in the range of approximately 900-1100° C., a radiation-based anneal process may be performed in order to further enhance the dopant activation while substantially not affecting any further dopant diffusion by correspondingly restricting the respective irradiation time. Hence, after the anneal process 115, a moderately high degree of activated dopants and healing of implantation-induced damages may be present.

As described above with regard to FIGS. 1a-1c, a thermal budget between the pre-amorphization implant process (110 in FIG. 1a) and the anneal process (115 in FIG. 1d), i.e., post source/drain extension formation (with formation of the first spacer structure) and prior to the anneal process, is substantially low with regard to the re-crystallization of the amorphous regions. The process flows as proposed by the present disclosure provide a clear cut-off between low thermal budget and high thermal budget. As explained above, following the low thermal budget prior to the anneal process, performance improvement by implantation of source/drain extension regions and source and drain regions into the amorphous regions is achieved without introducing additional processes or involving complex strain engineering, for example. Accordingly, the processes as proposed by the present disclosure do not impose deteriorating effects on throughput and cost.

With regard to FIGS. 2a-2c, further measures for improving the performance of NMOS devices will be described.

Figure 2A:
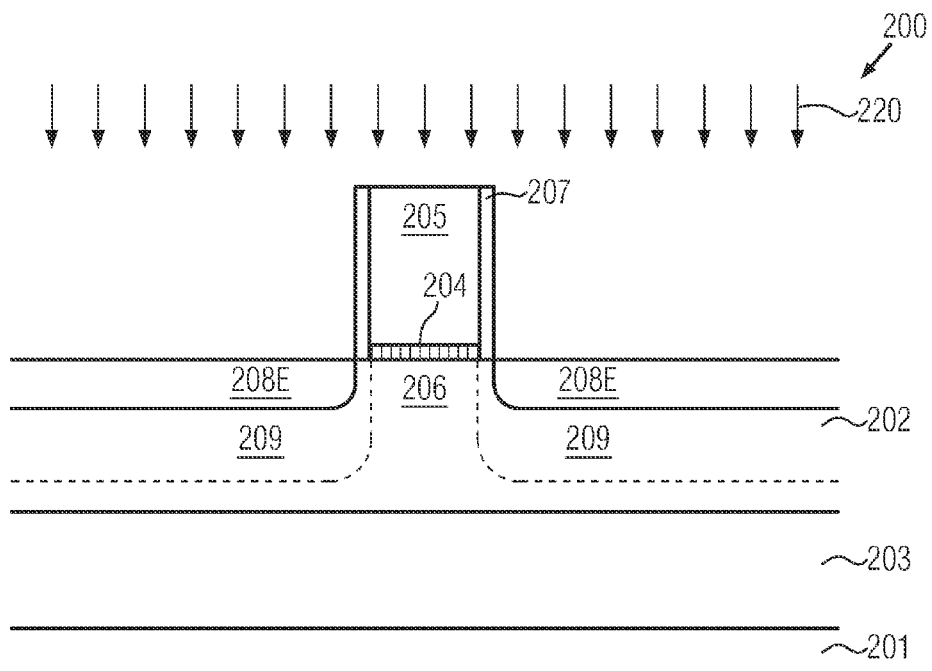
FIGS. 2a-2c schematically illustrate various illustrative embodiments of the present disclosure for implanting fluorine into an NMOS device in accordance with an aspect of the present disclosure.

FIG. 2a schematically illustrates a cross-sectional view of a semiconductor device 200, which represents an NMOS device in accordance with the semiconductor device 100 as described above with regard to FIG. 1b, i.e., after source/drain extensions regions 208E are formed in the amorphous regions 209. Accordingly, a substrate 201, a semiconductor layer 202 and a buried insulating layer 203 may correspond to the substrate 101, the semiconductor layer 102 and the buried insulating layer 103 as described above. The semiconductor layer 202 may be, for example, comprised of an appropriate semiconductor material, such as germanium (Ge), II-VI, III-V semiconductor compounds and the like. The buried insulating layer 203 may be, for example, comprised of any appropriate dielectric material, such as silicon dioxide, silicon nitride and the like. Alternatively, a bulk configuration may be implemented as described above with regard to FIG. 1a, i.e., the semiconductor layer 202 may have a thickness that is significantly greater than the vertical depth of any circuit element formed therein so that a common semiconductor body may be provided for a large number of circuit elements.

The semiconductor device 200 may further comprise a gate structure comprising a gate electrode 205 formed above the semiconductor layer 202 and separated therefrom by a gate insulation layer 204, wherein the gate electrode 205 may, in some illustrative embodiments, have a length of approximately 50 nm and less. It should further be understood that the gate electrode 205 may be provided in the form of an appropriate gate electrode material, such as polysilicon and the like, while, in other illustrative embodiments, the term "gate electrode" may also represent a respective dummy gate structure or replacement gate structure, which may be replaced by any appropriate material in a later manufacturing stage. On sidewalls of the gate electrode 205, a first spacer structure may be provided, such as a spacer liner 207, which may be comprised of any appropriate material, such as silicon dioxide, silicon nitride and the like. A configuration of the gate structure may substantially correspond to the gate structure of the semiconductor device 100 as described above.

Moreover, amorphous regions 209 (indicated by broken lines) are formed in the semiconductor layer 202 adjacent to and in alignment with the gate electrode 205 as described above with regard to FIG. 1a. For instance, the amorphous regions 209 may extend to approximately a depth corresponding to at least half the thickness of the semiconductor layer 202 (see discussion of depth Da with regard to FIG. 1a above).

Furthermore, the NMOS device 200 has source/drain extension regions 208E defined in the amorphous regions 209. The source/drain extension regions 208E represent doped regions of N-type conductivity formed by the first implantation process 112 as described above with regard to FIG. 1b employing dopants provided by group 5 elements. It is noted that an offset of the source/drain extension regions 208E form a corresponding channel region 206 which may be defined by the thickness of the first spacer structure, such as the spacer liner 207, as is also previously explained with reference to the device 100.

At the stage depicted in FIG. 2a, a third implantation process 220 is performed for implanting fluorine into the semiconductor layer 202 in alignment with the gate structure 205 and the first spacer structure 207. In some illustrative embodiments of the present disclosure, the energy of the third implantation process 220 may be on the order of 5-20 keV or on the order of 5-15 keV or on the order of 8-10 keV. In accordance some illustrative embodiments, the energy dose employed in the third implantation process 220 may be on the order of $10^{13}$ to $10^{15}$ $cm^{-2}$ or on the order of $10^{14}$ to $10^{15}$ $cm^{-2}$ or on the order of $4 \times 10^{14}$ to $1 \times 10^{15}$ $cm^{-2}$.

With regard to FIG. 2b, a further alternative embodiment will be described. FIG. 2b schematically illustrates an NMOS device 200' which may be substantially similar to the NMOS device 200 as described above, however, differing in that the third implantation process is not performed at the stage as described above with regard to FIG. 2a. Instead, a second spacer structure 213 is formed subsequent to the formation of the source/drain extension regions 208E. The second spacer structure 213 may be formed in accordance with the second spacer structure 113 as described above with regard to the semiconductor device 100. For example, the second spacer structure 213 may comprise one or more additional spacer elements 211, for instance in combination with a liner material 212.

Figure 2B:
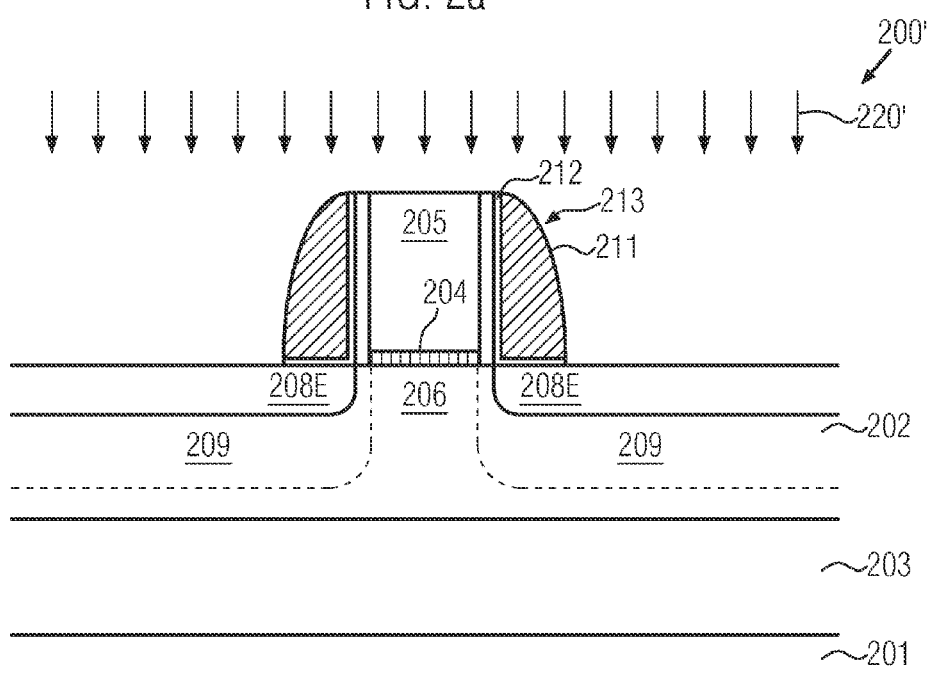
Figure 2C:
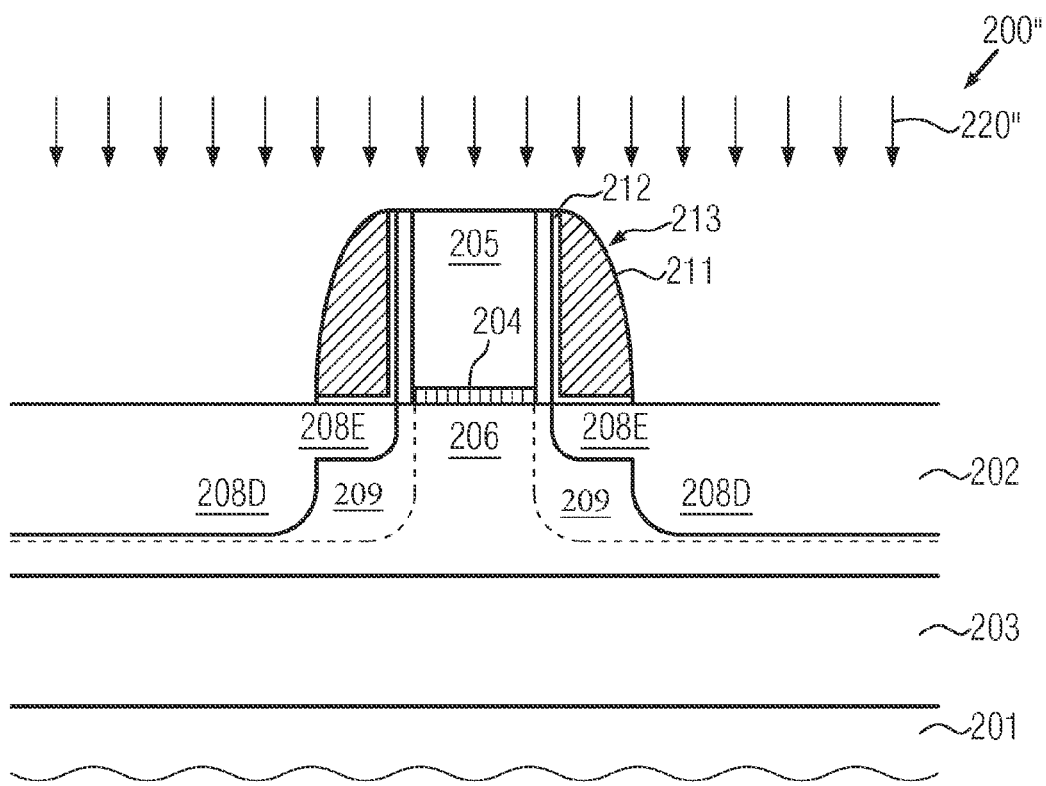

At the stage depicted in FIG. 2b, a third implantation process 220' is performed for implanting fluorine into the semiconductor layer 202 in alignment to the second spacer structure 213. In illustrative embodiments, the third implantation process 220' may be configured in analogy to the description of the third implantation process 220 above. Therefore, the third implantation process 220' is performed subsequent to the formation of the second spacer structure 213 and prior to the implantation of source and drain regions, i.e., a second implantation process 114 as described above.

With regard to FIG. 2c, a further alternative embodiment will be described. FIG. 2c schematically illustrates an NMOS device 200" which may be substantially similar to the NMOS device 200' as described above, however, differing in that the third implantation process 220' is not performed at the stage as described above with regard to FIG. 2b. Instead, a second implantation process (not illustrated) was performed resulting in the formation of source and drain regions 208D within the amorphous regions 209. The second implantation process (not illustrated) may be performed in analogy with the second implantation process 114 as described above with regard to the semiconductor device 100.

After the formation of source and drain regions 208D, a third implantation process 220" may be performed for implanting fluorine into the semiconductor layer 202 in alignment with the second spacer structure 213. The third implantation process 220" may be configured in analogy to the third implantation process 220 as described above with regard to FIG. 2a. Therefore, fluorine may be implanted into the source and drain regions 208D.

Alternatively, the third implantation process 220" may be performed simultaneously with the second implantation process.

The person skilled in the art will appreciate that subsequent to the third implantation process, processing may be continued with an anneal process, such as the anneal process 115 as described above with regard to FIG. 1d. For example, a well-established conventional RTA process or any other radiation-based process may be performed on appropriate process parameters in order to activate the implanted dopants and heal crystal damages caused by any of the previous implantation processes. For instance, an anneal process may comprise a heat treatment on the basis of moderately low temperatures of approximately 500-800° C., at which diffusion of dopants may be moderately low. In this case, an efficient re-crystallization may be obtained, wherein also dopant atoms may be effectively positioned at lattice sites. In other cases, a moderately high temperature may be applied so as to provide the desired dopant diffusion, wherein, prior to or after the application of the moderately high temperature, for instance in the range of approximately 900-1100° C., a radiation-based anneal process may be performed in order to further enhance the dopant activation while substantially not affecting any further dopant diffusion by correspondingly restricting the respective irradiation time. Hence, after the anneal process 115, a moderately high degree of activated dopants and healing of implantation-induced damages may be present.

As described above, a thermal budget between the pre-amorphization implant process (110 in FIG. 1a) and the anneal process, i.e., post source/drain extension formation (with formation of the first spacer structure) and prior to the anneal process, is substantially low with regard to the re-crystallization of the amorphous regions. The process flows as proposed by the present disclosure provide a clear cut-off between low thermal budget and high thermal budget. As explained above, following the low thermal budget prior to the anneal process, performance improvement by implantation of source/drain extension regions and source and drain regions into the amorphous regions is achieved without introducing additional processes or involving complex strain engineering, for example. Accordingly, the processes as proposed by the present disclosure do not impose deteriorating effects on throughput and cost.

Figure 3A:
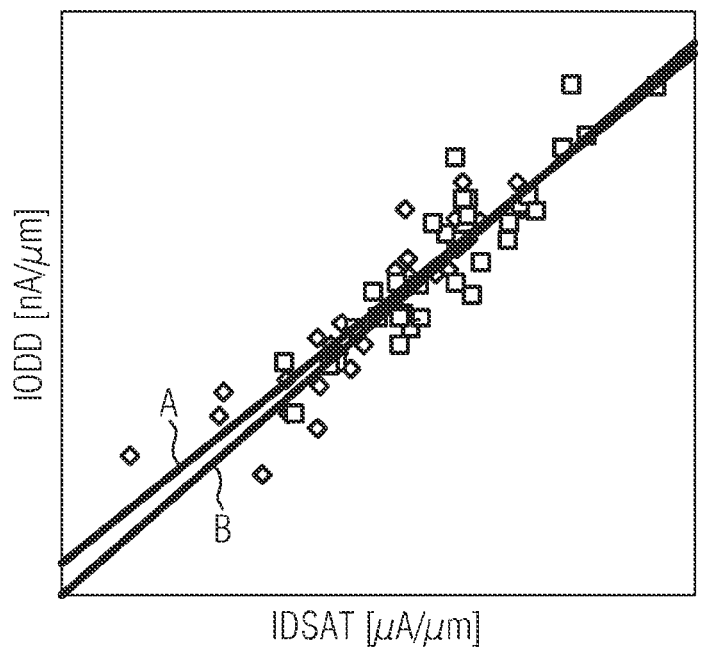
FIGS. 3a-3d schematically illustrate graphical relations indicating off-current (IODD) versus saturation current (IDSAT) characteristics of semiconductor devices as fabricated by the inventors in accordance with process flows involving high and low thermal budgets.

FIG. 3a shows schematically a relation between an off-current (IODD) versus a saturation drain current (IDSAT) of semiconductor devices as fabricated by the inventors in accordance with process flows in which no pre-amorphization implant process and no fluorine implantation are performed. According relations of IODD vs. IDSAT are often referred to as universal curves. Particularly, a curve A indicates the universal curve of semiconductor devices fabricated with low thermal budget and curve B indicates the universal curve of semiconductor devices fabricated with high thermal budget. As is shown in FIG. 3a, no change in the performance of semiconductor devices is obtained in employing low and high thermal budgets.

Figure 3B:
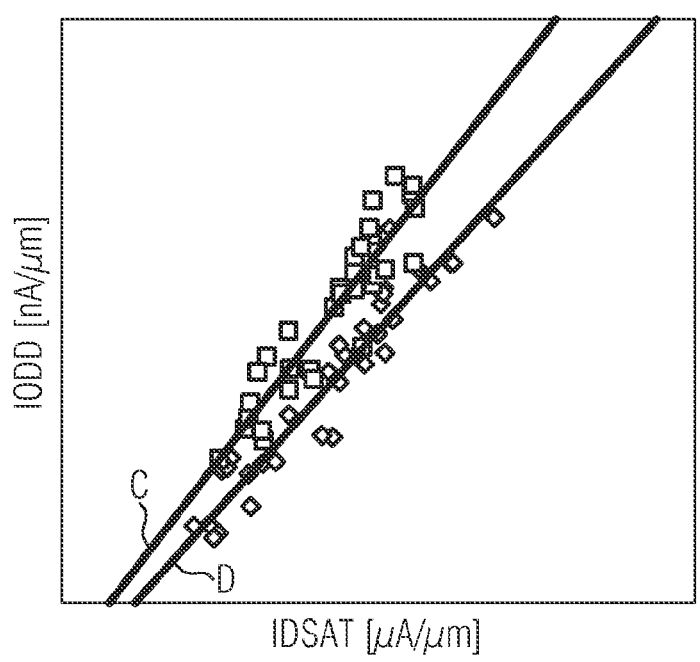

FIG. 3b shows schematically a relation between an off-current (IODD and a saturation current (IDSAT) of semiconductor devices as fabricated by the inventors in accordance with process flows in which a pre-amorphization implant process according to the present disclosure but no fluorine implantation are performed. In a low thermal budget scheme, as indicated by universal curve D, an improved IODD versus IDSAT characteristic of the semiconductor devices is obtained, as opposed to semiconductor devices fabricated by processes involving high thermal budget schemes, as indicated by universal curve C. Particularly, a higher off-current is present in semiconductor devices fabricated by processes involving high thermal budget schemes (curve C) as compared to semiconductor devices fabricated by processes involving low thermal budget schemes at similar saturation current (curve D).

Figure 3C:
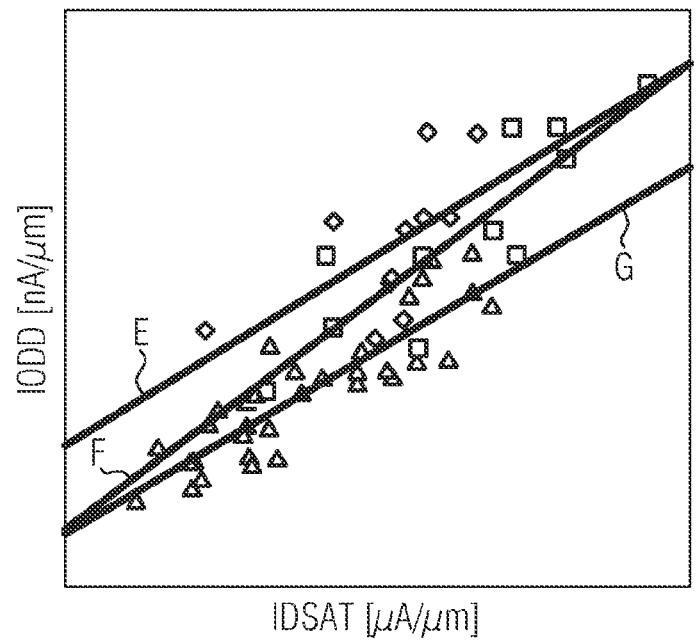

FIG. 3c shows schematically a relation between off-current (IODD) and saturation current (IDSAT) of NMOS devices as fabricated by the inventors in accordance with process flows in which no pre-amorphization implant process is performed. The depicted universal curves E, F and G represent relations between IODD and IDSAT of different process flows: process flows having a high thermal budget (universal curve E), process flows having a low thermal budget and no fluorine implantation (universal curve F) and process flows having a low thermal budget process and fluorine implantation (universal curve G). As shown in FIG. 3c, minor improvement of the off-current and saturation current characteristics may be achieved by low thermal budget processes in comparison with high budget processes.

Figure 3D:
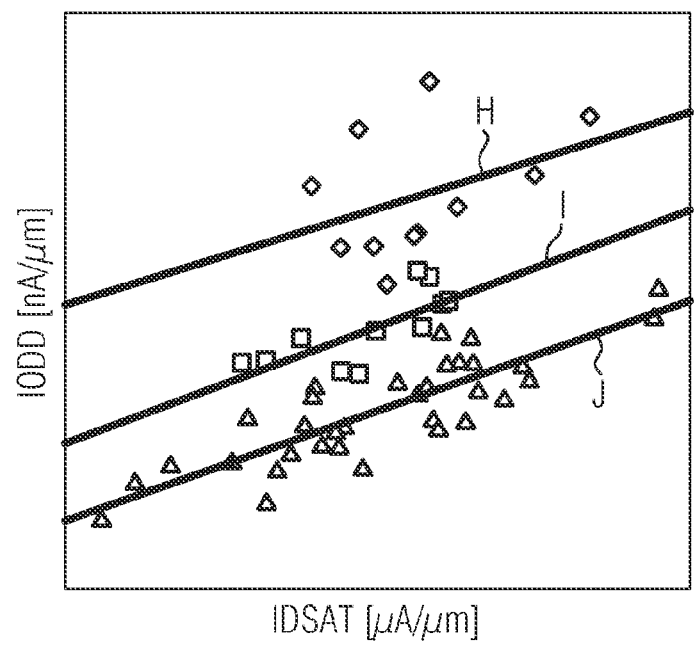

FIG. 3d schematically illustrates relations between off-current (IODD) and saturation current (IDSAT) of NMOS devices as fabricated by the inventors in accordance with process flows in which a pre-amorphization implant process in accordance with the present disclosure is performed. The depicted universal curves H, I and J represent relations between IODD and IDSAT of different process flows: process flows having a high thermal budget (universal curve H), process flows having a low thermal budget and no fluorine implantation (universal curve I) and process flows having a low thermal budget process and fluorine implantation (universal curve J). As shown in FIG. 3d, major improvement of the off-current and saturation current characteristics may be achieved by low thermal budget processes of the present disclosure in comparison with high budget processes. In the case of NMOS devices, implantation with fluorine as described above may, in combination with low thermal budget process flows, considerably increase the performance of NMOS devices.

The inventors understood that the thermal budget (TB) in between the formation of the source/drain extension regions, such as formation of light doped regions (LDD), and a rapid thermal anneal (RTA) process is crucial to the engineering of the source/drain extension regions. The performance of a semiconductor device depends on the dopant profile of the source/drain extension regions as, for example, the channel length of a semiconductor device is defined by the respective dopant profile.

The person skilled in the art will appreciate that the pre-amorphization allows for a clearly defined dopant profile for the source/drain extension regions and source/drain regions, therefore, improving the performance of semiconductor devices, such as MOSFET devices and HK/MG MOSFET devices. The identification of a clear cut-off between low and high thermal budgets, as suggested by the explanations above, in relation to re-crystallization of silicon substrate may have a limited impact on throughput and cost and enable fabrication of higher performance devices at advanced technology nodes without introducing complex process sequences into FEOL (front-end-of-line) process flows.

From the discussion above, it becomes clear that the pre-amorphization implant at source/drain extension region formation in accordance with disclosed low thermal budget schemes applied after the formation of source/drain extension region formation and prior to RTA represents a performance enabler for PFET (P-channel field effect transistor) and NFET (N-channel field effect transistor) semiconductor devices. The person skilled in the art will appreciate that the amorphous regions are sustained in the whole process flow prior to RTA and, therefore, early substrate re-crystallization is avoided.

The present disclosure provides for processes in which the thermal budget post light doped source/drain (formation of source/drain extension regions) to pre-rapid thermal anneal is low such that the engineering of light doped source/drain implants allows driving the device performance. It is proposed to employ a pre-amorphization implant process (PAI) in a low thermal budget process at post-light doped source/drain stage to pre-RTA as a performance enabler by avoiding early substrate re-crystallization. Therefore, PAI may be considered as a performance enabler for PMOS and NMOS devices. Optional core implantation of fluorine at light doped source/drain or source/drain provides additional improvement on NMOS devices. Therefore, co-implantation of fluorine together with low thermal budget schemes may be considered as representing an additional performance enabler for NMOS devices.

The person skilled in the art will appreciate that following a low thermal budget scheme, performance improvement by implant may be easily achieved as compared to strain engineering. Implantation schemes as proposed by the present disclosure have very limited impact on the throughput and on costs.

The present disclosure provides in some aspects a method of forming a semiconductor device, wherein amorphous regions are formed at an early stage during fabrication and the amorphous regions are conserved during subsequent processing sequences, and an intermediate semiconductor device structure with amorphous regions at an early stage during fabrication. Herein a gate structure is provided over a semiconductor substrate and amorphous regions are formed adjacent the gate structure. Source/drain extension regions or source/drain regions are formed in the amorphous regions. In some illustrative embodiments, fluorine may be implanted into the amorphous regions. After the source/drain extension regions and/or the source/drain regions are formed, a rapid thermal anneal process is performed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of fabricating a semiconductor device, comprising:
   providing a gate structure over a semiconductor substrate;
   performing a pre-amorphization implant process for forming amorphous regions adjacent said gate structure;
   performing a first implantation process for forming source/drain extension regions entirely in said amorphous regions;
   performing a second implantation process for forming source/drain regions entirely in said amorphous regions; and
   performing a rapid thermal anneal process after forming of said source/drain regions, wherein no process step performed between providing said gate structure and performing said rapid thermal anneal process has a temperature greater than 450° C.

2. The method of claim 1, wherein no process step performed between providing said gate structure and performing said rapid thermal anneal process has a temperature greater than 400° C.

3. The method of claim 1, further comprising forming a first spacer structure comprising spacers at each side of said gate structure prior to performing said first implantation process and/or prior to performing said second implantation process.

4. The method of claim 3, further comprising forming a second spacer structure over said first spacer structure after said first implantation process and prior to said second implantation process.

5. The method of claim 4, wherein forming at least one of said first spacer structure and said second spacer structure comprises performing an atomic layer deposition process.

6. The method of claim 1, further comprising performing a third implantation process for implanting fluorine into said amorphous regions.

7. The method of claim 6, wherein said third implantation process is performed after said first implantation process and prior to said second implantation process.

8. The method of claim 6, wherein said third implantation process is performed during said second implantation process.

9. The method of claim 6, wherein said third implantation process is performed after said second implantation process.

10. The method of claim 6, wherein said semiconductor device is an NMOS device.

11. A method of fabricating a semiconductor device, comprising:
   providing a gate structure over a semiconductor substrate;
   performing a pre-amorphization implant process for forming amorphous regions adjacent said gate structure;
   performing a first implantation process for forming source/drain extension regions entirely in said amorphous regions;
   performing a second implantation process for forming source/drain regions entirely in said amorphous regions;
   performing a third implantation process for implanting fluorine into said amorphous regions; and
   performing a rapid thermal anneal process after said source/drain regions are formed in said amorphous regions, wherein no process step performed between providing said gate structure and performing said rapid thermal anneal process has a temperature greater than 450° C.

12. The method of claim 11, wherein said third implantation process is performed during or after said source/drain regions are formed in said amorphous regions.

13. The method of claim 11, wherein no process step between providing said gate structure and performing said rapid thermal anneal process has a temperature greater than 400° C.

14. The method of claim 11, further comprising forming a first spacer structure comprising spacers at each side of said gate structure prior to performing said first implantation process and/or prior to performing said second implantation process.

15. The method of claim 14, further comprising forming a second spacer structure over said first spacer structure after said first implantation process and prior to said second implantation process.

16. The method of claim 15, wherein forming at least one of said first spacer structure and said second spacer structure comprises performing an atomic layer deposition process.

* * * * *